United States Patent
Takahashi et al.

(10) Patent No.: US 10,338,260 B2
(45) Date of Patent: Jul. 2, 2019

(54) METAL DETECTION APPARATUS AND METAL DETECTION METHOD

(71) Applicant: ANRITSU INFIVIS CO., LTD., Kanagawa (JP)

(72) Inventors: Yoshifumi Takahashi, Kanagawa (JP); Osamu Tanaka, Kanagawa (JP); Kazunori Sakata, Kanagawa (JP)

(73) Assignee: ANRITSU INFIVIS CO., LTD., Kanagawa (JP)

(*) Notice: Subject to any disclaimer, the term of this patent is extended or adjusted under 35 U.S.C. 154(b) by 0 days.

(21) Appl. No.: 16/051,654

(22) Filed: Aug. 1, 2018

(65) Prior Publication Data

US 2019/0041537 A1 Feb. 7, 2019

(30) Foreign Application Priority Data

Aug. 2, 2017 (JP) .................. 2017-149796

(51) Int. Cl.
*G01V 3/10* (2006.01)
*G01R 33/12* (2006.01)

(52) U.S. Cl.
CPC ............ *G01V 3/10* (2013.01); *G01V 3/104* (2013.01); *G01R 33/12* (2013.01)

(58) Field of Classification Search
CPC .................... G01V 3/10; G01R 33/12
See application file for complete search history.

(56) References Cited

U.S. PATENT DOCUMENTS

| 7,106,056 B2* | 9/2006 | Czipott | G01V 3/08 324/228 |
| 2005/0270154 A1* | 12/2005 | Nelson | F41H 11/12 340/551 |
| 2009/0323046 A1* | 12/2009 | Tan | E01H 1/00 356/4.01 |
| 2010/0134102 A1* | 6/2010 | Crowley | G01V 3/101 324/307 |
| 2019/0011591 A1* | 1/2019 | Takahashi | G01N 27/82 |

FOREIGN PATENT DOCUMENTS

JP 2001-066372 A 3/2001

* cited by examiner

*Primary Examiner* — Huy Q Phan
*Assistant Examiner* — Zannatul Ferdous
(74) *Attorney, Agent, or Firm* — Pearne & Gordon LLP

(57) ABSTRACT

Detection of contained metal contained in an article can be carried out with a high sensitivity with a simple operation in a limited space. A transmission coil 42 that generates a magnetic field for inspection from an upper surface side through a lower surface side of a placing table 21 and a plurality of magnetic sensors 43 for detecting the magnetic field are provided in a head 40 disposed on a lower surface side of the placing table 21 for placing an article which is an inspection object. When the head 40 is scanned so as to cover the entire lower surface-side region of the placing table 21, metal being contained in the article placed on the placing table 21 is detected on the basis of a change in the magnetic field being detected by the magnetic sensors 43.

9 Claims, 7 Drawing Sheets

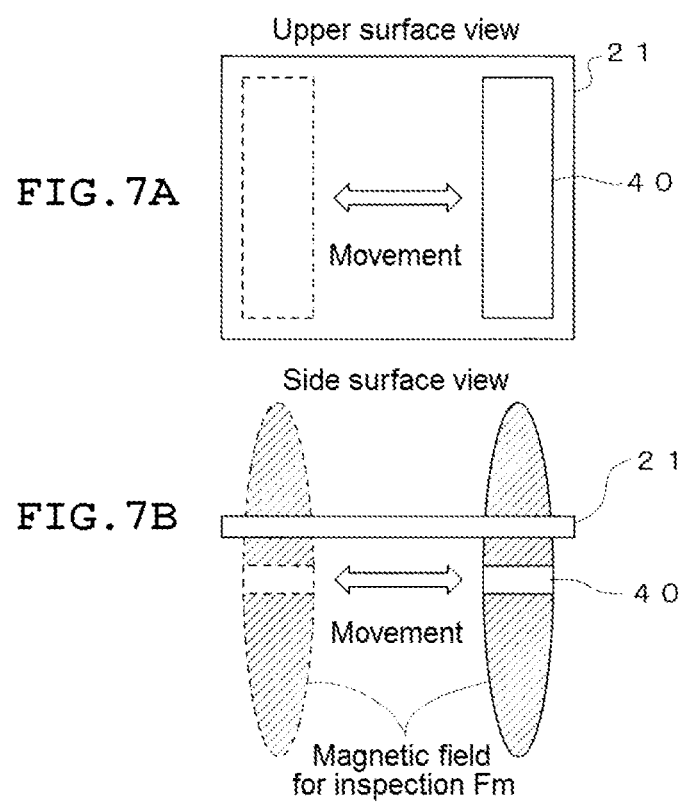

METAL DETECTION APPARATUS AND METAL DETECTION METHOD

TECHNICAL FIELD

The present invention relates to a technique enabling the high-sensitivity detection of unexpected foreign metal contained in an article in a limited space for installation in a metal detection apparatus that detects foreign metal contained in an article.

BACKGROUND ART

In automated factories of food or the like, products manufactured in a manufacturing line are transported to a packaging line using a transportation apparatus such as a conveyor, and packaged products are shipped, but quality inspection of the products is carried out between packaging and shipment.

In this quality inspection, as an apparatus that detects foreign metal contained in the products, a metal detection apparatus has been used in the related art. In the metal detection apparatus, basically, a magnetic field for inspection is generated in a region through which an inspection object passes (for example, on the conveyor), and a change in the magnetic field caused by foreign metal contained in a product passing through the region is detected using a magnetic sensor such as a coil or a Hall element.

As described above, strict inspection of foreign substances is carried out on product-manufacturing sites, but supermarkets (hereinafter, abbreviated as SMKT), convenience stores (hereinafter, abbreviated as CVS), and the like employ a system allowing customers to freely touch and select products on display, and thus it is possible to intentionally insert metal such as a needle into commercially available products, and, when the above-described unexpected foreign metal-containing commercially available product is purchased, damage is caused to the customer who purchased this product, and the credit of the store significantly drops.

Therefore, SMKT, CVS, and the like investigate the introduction of an unexpected foreign metal detection apparatus capable of inspecting whether or not a metal foreign substance is contained in a commercially available product when the customer makes a payment for the commercially available product brought to a counter with an intention of purchasing the product.

As a metal detection apparatus that can be employed in SMKT, CVS, and the like, Patent Document 1 describes an example in which a flat metal detection apparatus is used on a counter table in a counter.

In the metal detection apparatus disclosed by Patent Document 1, an upper plate 121 on which an article is place is supported by an upper surface of a counter table in a counter, a transmission coil 123 is wound around the outermost circumference of a rectangular head frame 122 fixed to a lower surface side of the upper plate 121, two receiving coils 124 and 125 having the same bore are disposed side by side in the transmission coil 123, and magnetic fluxes generated by the transmission coil 123 are almost equally interlinked with the receiving coils 124 and 125.

Therefore, when an article placed on the upper plate 121 has metal contained therein, a difference is generated between the interlinked magnetic fluxes of the two receiving coils 124 and 125 due to the influence of the metal on the magnetic field, and whether or not metal is contained in a commercially available product can be determined by detecting the difference in the magnetic fluxes.

RELATED ART DOCUMENT

Patent Document

[Patent Document 1] JP-A-2001-66372

DISCLOSURE OF THE INVENTION

Problem that the Invention is to Solve

However, in the metal detection apparatus having the above-described configuration, the location of metal contained in a commercially available product placed on the upper plate 121 and the locations of the two receiving coils are fixed during inspection, and thus, for example, when the contained foreign metal is present in the vicinity of the border between the two receiving coils, there are cases in which the influences of the contained metal on the interlinked magnetic fluxes of both receiving coils become almost the same, the difference becomes small, and the contained metal cannot be detected. In addition, for example, in a case in which one of two contained metals is present at a location at which the contained metal intersects the interlinked magnetic fluxes of one receiving coil, the other of the two contained metals is present at a location at which the contained metal intersects the interlinked magnetic fluxes of the other receiving coil, and the influences of both contained metals on the respective interlinked fluxes are almost the same, likely, the difference between the interlinked magnetic fluxes of both receiving coils becomes small, and there are cases in which the contained metals cannot be detected. In addition, even in a case in which the same metal is contained in a commercially available product, the detection sensitivity to the contained metal significantly changes depending on the placed location, orientation, position, and the like of the commercially available product on the upper plate 121, and there are cases in which the contained metal cannot be detected.

In addition, it is also possible to inspect a commercially available product which is an inspection object by swiping the commercially available product over the upper plate 121 by a store staff; however, in this case, the passing height, position, speed, and the like of the commercially available product over the upper plate 121 become uneven, and accurate inspection cannot be carried out.

Therefore, it also has been considered to employ a structure of an article transportation-type metal detection apparatus which is used in a manufacturing line, but installing the article transportation-type metal detection apparatus on a counter table in a counter or the like is difficult due to a problem of a space or workability.

An object of the present invention is to solve the above-described problem and provide a metal detection apparatus and a metal detection method which are capable of inspecting metal contained in an article with a high sensitivity with a simple operation in a limited space.

Means for Solving the Problem

In order to achieve the above-described object, a metal detection apparatus of claim 1 of the present invention is a metal detection apparatus for detecting foreign metal being contained in an article which is an inspection object, the metal detection apparatus including:

a table (21) for placing the article, magnetic field generation means (42 and 60) for generating a magnetic field for inspection over an upper surface with a predetermined largeness of the table on which the article is placed from a lower region of the table which overlaps the upper surface, a magnetic sensor portion (43) which is disposed in the lower region of the table and detects a near magnetic field with a sensing area narrower than the lower region, scanning means (34, 41c, 51, 52, and 55) for moving a location of the magnetic sensor portion so that the sensing area of the magnetic sensor portion covers the entire lower region of the table, and determination means for determining presence or absence of the foreign metal being contained in the article placed on the table on the basis of a change in a magnetic field being detected by the magnetic sensor portion being moved by the scanning means.

In addition, a metal detection apparatus of claim 2 of the present invention is the metal detection apparatus according to claim 1, in which the scanning means is configured so as to move the magnetic sensor portion in a linear or rotational manner in the lower region, and the magnetic field generation means changes an inspection condition for the magnetic field for inspection in association with switching a movement direction of the magnetic sensor portion by the scanning means.

In addition, a metal detection apparatus of claim 3 of the present invention is the metal detection apparatus according to claim 1, further including:

article detection means (70) for detecting that the article is placed on the upper surface of the table, in which the scanning means initiates movement of the magnetic sensor portion whenever the article detection means detects that the article is placed on the upper surface of the table.

In addition, a metal detection method of claim 4 of the present invention is a metal detection method for detecting foreign metal being contained in an article which is an inspection object, the metal detection method including:

a step of generating a magnetic field for inspection over an upper surface with a predetermined largeness of a table (21) for placing the article from a lower region of the table which overlaps the upper surface, a step of moving a location of a magnetic sensor portion (43) which is disposed in the lower region of the table and detects a near magnetic field with a sensing area narrower than the lower region so that the sensing area of the magnetic sensor portion covers the entire lower region of the table, and a step of detecting foreign metal being contained in the article placed on the table on the basis of a change in a magnetic field being detected by the magnetic sensor portion being moved.

In addition, a metal detection method of claim 5 of the present invention is the metal detection method according to claim 4, in which the magnetic sensor portion is moved in a linear or rotational manner in the lower region, and an inspection condition for the magnetic field for inspection is changed in association with switching a movement direction of the magnetic sensor portion.

In addition, a metal detection method of claim 6 of the present invention is the metal detection method according to claim 4, further including:

a step of detecting that the article is placed on the upper surface of the table, in which movement of the magnetic sensor portion is initiated whenever it is detected that the article is placed on the upper surface of the table.

Advantage of the Invention

As described above, in the present invention, a magnetic field for inspection is generated over the upper region with a predetermined largeness in the placing table on which an article is placed from the lower surface-side region which overlaps the upper surface, the magnetic sensor disposed in the lower surface-side region of the placing table is moved in the lower surface-side region of the placing table, a change in the magnetic field in the entire lower surface-side region is obtained, and metal contained in the article placed on the placing table is detected.

Therefore, the location of the foreign metal contained in the article placed on the placing table and the relative location with the magnetic sensor change inevitably, and thus it is possible to detect foreign metal with a high sensitivity regardless of the location of the contained metal.

In addition, it is not necessary to transport articles, and there is no problem with a space or workability even when the metal detection apparatus is installed on a counter table or the like in a counter.

In addition, in the metal detection apparatus and the metal detection method in which the inspection condition for the magnetic field for inspection is changed in association with switching the movement direction of the magnetic sensor in the lower surface-side region of the placing table, it is possible to carry out inspection on a single article under a plurality of different inspection conditions, and more accurate inspection can be carried out.

BRIEF DESCRIPTION OF THE DRAWINGS

FIGS. 7A and 7B illustrate a relationship between a range of a magnetic field and a region of a placing table of a metal detection apparatus in which the magnetic field for inspection is moved.

BEST MODE FOR CARRYING OUT THE INVENTION

Hereinafter, an embodiment of the present invention will be described on the basis of drawings.

Figure 1:
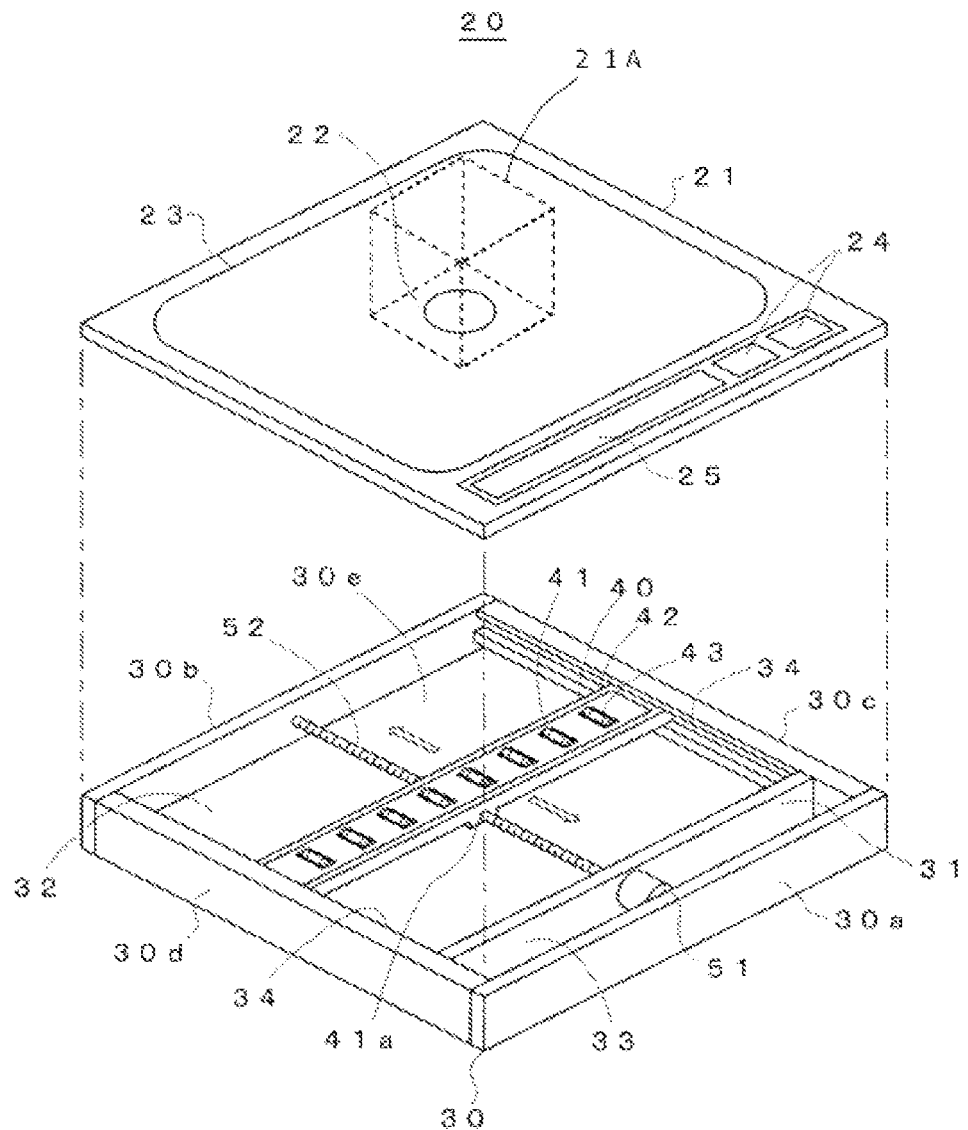
FIG. 1 illustrates a mechanism configuration of an embodiment of the present invention.
Figure 2:
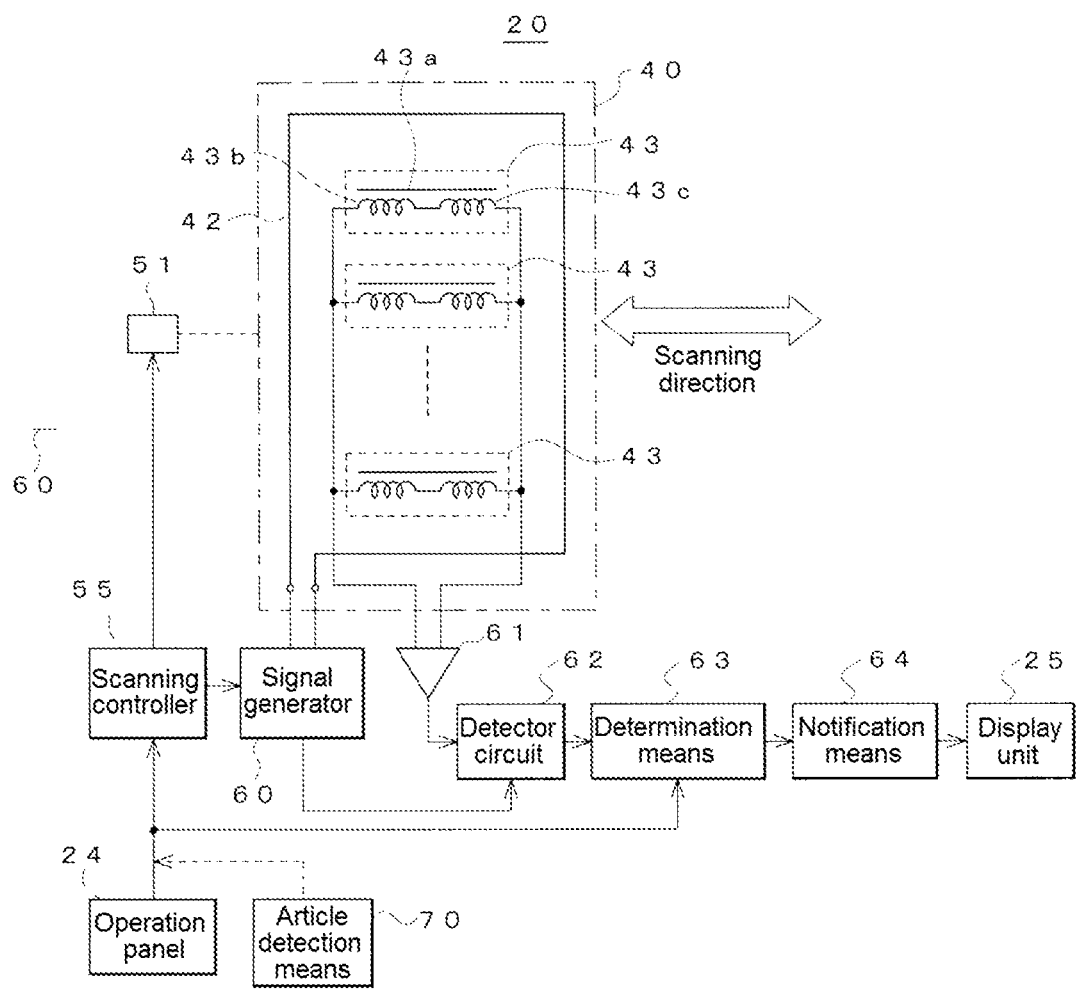
FIG. 2 is a block diagram illustrating an electric configuration of the embodiment of the present invention.

FIG. 1 is an exploded view of a part illustrating a mechanical configuration of a metal detection apparatus 20 to which the present invention is applied, and FIG. 2 is a function block diagram illustrating an electric configuration.

As illustrated in FIG. 1, the metal detection apparatus 20 has a placing table 21, a case 30, and a head 40. The placing table 21 for placing an article (shown schematically in FIG. 1 as 21A) has a substantially rectangular flat plate shape, is formed of a non-metal that passes magnetic fluxes with a small loss (for example, a synthetic resin), and have, for example, four corners that can be fixed ton an upper surface side of the case 30 using screws (non-metal) or the like.

At almost the center of an upper surface of the placing table 21, a mark (a small circular shape in the drawing) 22 that displays the central location as a guide in the placing of an article is indicated, and a region frame 23 that displays an entire region for placing an article is indicated. The display form of the mark 22 or the region frame 23 is not limited to that in this example and is arbitrary, and the shape of the mark 22 may be displayed as a shape other than a circular shape, for example, a cross shape, a triangular shape, or a quadrilateral shape, and the region frame 23 is not only displayed using a line, but may also be indicated so as to be distinguishable using a color difference, a pattern difference, or the like.

In addition, on one end side of the upper surface of the placing table 21, an operation panel 24 such as a press button switch, and a display unit 25 are provided. In the display unit 25, a light emitter, for example, LED is included in order to notify the presence or absence of contained metal with light. Meanwhile, here, the operation panel 24 or the display unit 25 is provided in an edge of the placing table 21; however, in the case of having a non-ignorable influence on a magnetic field for inspection, the operation panel 24 or the display unit 25 may be separately provided at a location sufficiently apart from the placing table 21.

The case 30 is made of, similar to the placing table 21, a non-metal, is formed of a front plate 30a, a rear plate 30b, side plates 30c and 30d, and a bottom plate 30e in a bottomed rectangular box shape that is almost the same as the outer form of the placing table 21, and has a structure in which an open upper surface side is blocked by the placing table 21. An inside of the case 30 is split into a space 32 having a large depth and a space 33 having a small depth by a division plate 31 joined to the side plates 30c and 30d at both ends, the head 40 is supported by the space 32, and a motor 51 as a driving source for moving the head 40, other electronic circuits, and the like are stored in the space 33.

In addition, the region frame 23 on the upper surface of the placing table 21 is displayed so as to almost match an outer edge of the space 32, and the operation panel 24 and the display unit 25 are provided at a location overlapping the space 33. Here, the motor 51, other electronic circuits, and the like being stored in the space 33 are described to have a small influence on the magnetic field for inspection; however, similar to the operation panel 24 or the display unit 25, in the case of having a non-ignorable influence on the magnetic field for inspection, the space 33 and the motor 51, other electronic circuits, and the like being stored therein may be separately provided at a location sufficiently apart from the space 32 in which the head moves.

In portions that form both side portions of the space on the inner wall side of the side plates 30c and 30d, groove-like guide rails 34 that sandwich both ends of the head 40 in a state of having small gaps from upper and lower ends and guide the horizontal movement of the head 40 are provided.

A substrate 41 of the head 40 is made of a non-metal, for example, a synthetic resin and formed in a substantially flat plate shape of a horizontally long rectangle, and both ends thereof are vertically sandwiched by the guide rails 34 and supported in a state in which the substrate is capable of sliding along a short side direction.

Around an outer edge of the substrate 41 on an upper surface side, a transmission coil 42 that configures magnetic field generation means of this embodiment together with a signal generator 60 described below is wound in an oblong shape, and, in the transmission coil 42, a plurality of (eight in the drawing) magnetic sensors 43, 43, . . . , 43 is disposed side by side at almost equal intervals in a longitudinal direction of the head 40.

The transmission coil 42 is a member for generating a magnetic field for inspection across an upper surface on an upper side of the placing table 21 on which the article is placed (an inside of the region frame 23) and a lower surface-side region on a lower surface side of the placing table 21 which overlaps the upper surface (in this example, a region overlapping the space 32), is excited by a signal (any of alternate current, direct current, or alternate current+direct current) being supplied from the signal generator 60 described below, and generates the magnetic field for inspection. In the following description, an example of the magnetic field generation means being configured of the transmission coil 42 and the signal generator 60 will be described, but a permanent magnet may be used, or a permanent magnet and the coil (also including the signal generator) may be jointly used.

In addition, here, the transmission coil 42 has a length that is almost the same as the length of the upper surface or the lower surface and has a width that is significantly narrower than the width of the upper surface or the lower surface, and the magnetic field for inspection generation range also becomes narrower as much, but the magnetic field for inspection can be generated throughout the entire upper region in which the inspection article occupies or the entire lower region by the movement of the head 40 in the width direction. As described below, as the transmission coil 42, a transmission coil having almost the same size as that of the upper surface or the lower surface may be provided in a fixed manner. However, in such a case, a signal power necessary to obtain a magnetic field having a desired intensity (that is, a desired magnetic flux density) increases.

Figure 4:
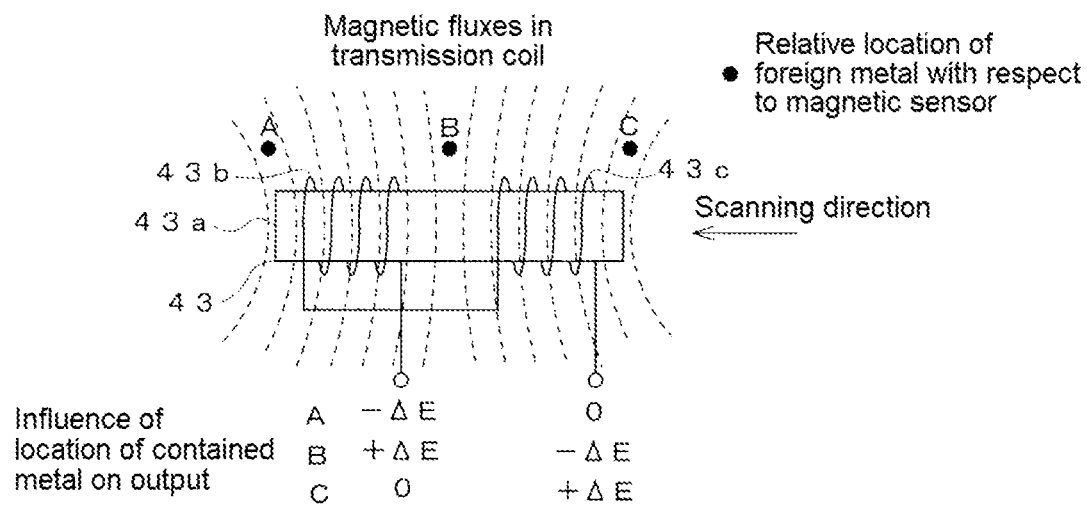
FIG. 4 illustrates variation of an output signal depending on a location of a magnetic sensor with respect to a foreign metal.

Meanwhile, the magnetic sensor 43 is disposed in the lower region of the placing table 21 and is a member for detecting a magnetic field generated by the magnetic field generation means, and, in this embodiment, as illustrated in FIG. 2 and FIG. 4, a magnetic sensor configured by a pair of receiving coils 43b and 43c at an interval and differentially connecting the receiving coils to both ends of a core 43a of a ferromagnetic body (for example, an amorphous magnetic body) is used. The coil length and the coil diameter of the receiving coils 43b and 43c in the magnetic sensor 43 determine the sensing area with respect to the magnetic field, and the sensing area is significantly smaller than the lower region of the placing table 21, and thus it is possible to locally detect a change in the magnetic field in the entire lower region of the placing table 21. In order to cover the entire lower region of the placing table 21 using only one of the magnetic sensors 43 as magnetic field detection means, it is necessary to scan the magnetic sensor 43 two-dimensionally, which extends the inspection time.

Therefore, in this embodiment, a plurality of (eight in the drawing) the magnetic sensors 43 are arranged at equal intervals in the longitudinal direction of the lower region and moved in the width direction, whereby it becomes possible to cover the entire lower region with one-dimensional scanning (direct movement). However, the sensing areas of the plurality of magnetic sensors 43 are set so that even the total thereof is narrower than the lower region.

Meanwhile, in the embodiment, the plurality of magnetic sensors will be collectively referred to as the magnetic sensor portion. However, it is also possible to configure the magnetic sensor portion using only one magnetic sensor, and, in this case, the magnetic sensor portion may be scanned two-dimensionally as described above.

In addition, here, the array direction of the pair of receiving coils 43*b* and 43*c* (the longitudinal direction of the core 43*a*) is set to be orthogonal to the array direction of the magnetic sensors 43 (the longitudinal direction of the head 40) so as to dispose a number of magnetic sensors in the limited long side dimension of the head 40 and thus increase the detection resolution of foreign metal; however, as described below, the angle of the array direction of the magnetic sensors with respect to the array direction of the pair of receiving coils may be set to an angle other than 90 degrees (not orthogonal) or the magnetic sensors may be arrayed in a plurality of columns.

In the middle portion of the substrate 41 of the head 40 in the longitudinal direction, a screw hole 41*a* having a screw groove formed in the inner circumference is formed so as to penetrate the middle portion in a direction orthogonal to the longitudinal direction of the substrate 41, and a driving shaft 52 which is made of non-metal and has a screw groove formed in the outer circumference is inserted in a screwed state into the screw hole 41*a*. One end side of the driving shaft 52 is coupled with a motor 51 on the division plate 31 side, and the other end side is supported by the rear plate 30*b* of the case 30 so as to be capable of rotating. Therefore, for example, when the motor 51 is driven to normally rotate, and the driving shaft 52 normally rotates, the head 40 moves toward the division plate 31, and, when the motor 51 is driven to reversely rotate, and the driving shaft 52 reversely rotates, the head 40 moves toward the rear plate 30*b*. Meanwhile, the motor 51 is provided with a structure having no influences on magnetic fields being detected by the magnetic sensors 43 (for example, an magnetically shielded structure).

That is, in this embodiment, the plurality of magnetic sensors 43, 43, . . . , 43 is linearly scanned in a reciprocating manner in the lower region of the placing table 21 by scanning means including the guide rails 34, the screw hole 41*a*, the motor 51, and the driving shaft 52 and covers the entire lower region. The scanning means has a structure in which the driving shaft 52 screwed into the screw hole 41*a* of the head 40 is rotated by a rotary force of the motor 51 and the head 40 is linearly scanned in a reciprocating manner, but may have a variety of structures other than the above-described structure.

For example, the scanning means may have a structure in which both ends of the head 40 are supported by a pair of endless belts being driven to orbit by the driving of the motor, and the driving direction of the endless belts is switched, thereby scanning the head 40 in a linearly-reciprocating manner in a certain range or turning the head 40 around the central portion or one end side thereof in a reciprocating manner in a certain angular range or a structure in which the head is continuously rotated in a constant direction. In addition, it is also possible to employ a structure in which, as a driving source, instead of the motor 51 which is likely to influence the magnetic field, a cylinder being driven by the pressure of the air is used, the shaft of the cylinder is driven so as to protrude or retreat, and the head 40 is moved in a linearly or rotationally-reciprocating manner, and it is also possible to employ a structure in which, using an ultrasonic motor or the like which does not use a magnetic action, the driving shaft 52 is rotated or the head 40 is directly moved.

Wires of the transmission coil 42 and the plurality of magnetic sensors 43, 43, . . . , 43 of the head 40 are connected to, for example, a circuit board (not illustrated) in the space 33 through flexible cables not illustrated.

As illustrated in FIG. 2, this metal detection apparatus 20 has a scanning controller 55 that drives the motor 51, a signal generator 60 that supplies signals for generating a magnetic field for inspection in the transmission coil 42, a differential amplifier 61 that receives the parallel connection output of the respective magnetic sensors 43 with a differential input terminal, a detector circuit 62 that synchronized-detects the output of the differential amplifier 61 with an output signal of the signal generator 60, determination means 63 for determining the presence or absence of contained foreign metal by comparing the output of the detector circuit 62 and a predetermined threshold, and notification means 64 for notifying the determination result by the determination means 63. In a case in which contained foreign metal is determined to be present, the notification means 64 displays, for example, red light on the display unit 25 and generates sound with a buzzer not illustrated, thereby notifying the presence of contained foreign metal.

The scanning controller 55 receives an inspection control signal being output by the operation of the operation panel 24, drives the motor 51, and scans the head 40. Meanwhile, there are cases in which this inspection control signal is output from article detection means 70 described below.

Figure 3A:
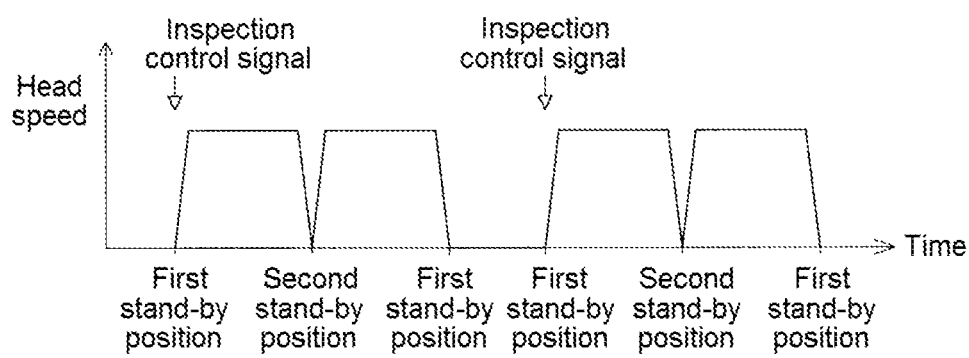
FIGS. 3A and 3B illustrate a relationship between inspection control signals and movement of a head.

In addition, while not illustrated, in the case 30, a sensor that, for example, optically detects the fact that the front end of the head 40 comes to a location at which the front end almost comes into contact with the inner wall of the division plate 31 (a first stand-by position) and the fact that the rear end of the head 40 comes to a location at which the rear end almost comes into contact with the inner wall of the rear plate 30*b* (a second stand-by position) is provided, and an operation in which the scanning controller 65, for example, as illustrated in FIG. 3A, set the first stand-by position as a scanning start position and, when receiving an inspection control signal, moves the head 40 from the first stand-by position up to the second stand-by position at an almost constant rate, stops the head, furthermore, moves the head from the second stand-by position up to the first stand-by position at an almost constant rate, and stops the head is repeated.

Figure 3B:
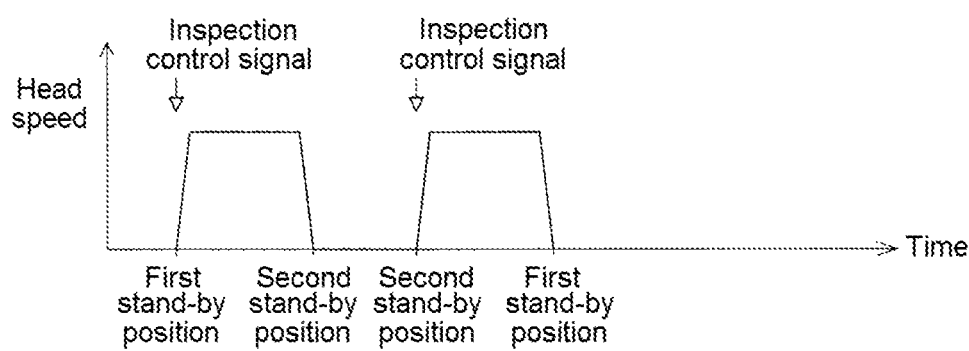

Meanwhile, here, whenever the inspection control signal for carrying out inspection on the article placed on the placing table 21 is output, the head 40 is reciprocated once between the two stand-by position, thereby preventing the detection failure of contained foreign metal attributed to the difference in the head scanning direction; however, when the head 40 is configured to be scanned from one stand-by position up to the other stand-by position (one-way scanning) whenever the inspection control signal for carrying out inspection on the article placed on the placing table 21 is output as illustrated in FIG. 3B, it is possible to increase the inspection efficiency.

Next, a change in the magnetic field being detected by the magnetic sensor 43 of the head 40 will be described simply.

In a case in which there is no foreign metal contained in an article which is an inspection object, magnetic fluxes being generated by the transmission coil 42 almost equally intersect the two receiving coils 43*b* and 43*c*, and thus signals having almost the same amplitude and phase, which are determined at the connection point between the coils as a criterion, are output from the output terminals of the receiving coils 43b and 43c, the input and output of the differential amplifier 61 becomes almost zero, and the detection output also becomes almost zero.

Meanwhile, when an article including contained metal is placed on the placing table 21, and an inspection control signal is output by, for example, the operation of the operation panel 24, the head 40 is scanned by the scanning controller 55, when the location of the contained foreign metal comes to a location A near the receiving coil 43b on one end side of the core 43a of the magnetic sensor 43 as illustrated in FIG. 4, the influence of the contained foreign metal on the magnetic fluxes interlinked with the receiving coil 43b increases (the interlinked magnetic fluxes increase in a case in which the contained foreign metal is an ferrous metal and the interlinked magnetic fluxes decrease in a case in which the contained metal is a nonferrous metal), and the influence on the magnetic fluxes interlinked with the receiving coil 43c decreases, and thus, in the output of the differential amplifier 61, a signal with an amplitude of a predetermined amount ΔE corresponding to a change in the magnetic field received by one receiving coil 43b appears.

In addition, when the head 40 is further scanned, and the location of the contained foreign metal becomes almost a middle location B between both receiving coils 43b and 43c, the influences of the contained foreign metal on the magnetic fluxes interlinked with both receiving coils 43b and 43c becomes almost the same, the output of one receiving coil 43b, for example, changes toward the positive (+) side by the predetermined amount ΔE, and the output of the other receiving coil changes toward the negative (−) side almost by the predetermined amount ΔE, and thus, in the output of the differential amplifier 61 obtaining the difference, a signal which becomes an amplitude 2ΔE that is almost twice the predetermined amount which corresponds to the changes of the magnetic field of both receiving coils 43b and 43c is output.

In addition, when the head 40 is further scanned, and the location of the contained foreign metal comes to a location C near the receiving coil 43c on the other end side of the core 43a of the magnetic sensor 43, in opposition to the case of the location A, the influence of the contained foreign metal on the magnetic fluxes interlinked with the receiving coil 43c increases, and the influence on the magnetic fluxes interlinked with the receiving coil 43b decreases, and thus, in the output of the differential amplifier 61, a signal with an amplitude of the predetermined amount ΔE corresponding to the change in the magnetic field received by the receiving coil 43c appears.

Figure 5:
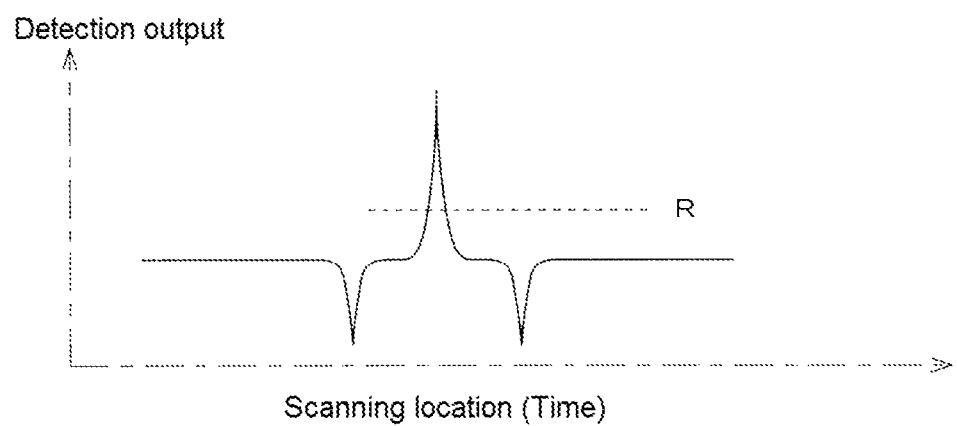
FIG. 5 illustrates an example of a detection output.

Therefore, when the head 40 passes under the contained foreign metal, for example, a detection output waveform as illustrated in FIG. 5 appears. The determination means 63 compares a level of detection output being input from the reception of the inspection control signal to the completion of the scanning of the head 40 with a predetermined threshold R, thereby determining the presence or absence of contained foreign metal.

The determination result is output to the notification means 64, and, in a case in which contained foreign metal is determined to be present, the notification means carries out a display (for example, turn on a red lamp for the presence of a foreign substance or turn on a green lamp for the absence of a foreign substance) notifying this fact on the display unit 25 and generates a buzzer sound.

In the above-described example, as the magnetic field for inspection, an alternate current magnetic field from which the sensitivity to both ferrous metal and nonferrous metal can be obtained is used; however, in a case in which the head 40 is scanned in a reciprocating manner for a single time of the output of the inspection control signal as described above, it is possible to broaden the kind of detectable foreign substances by switching inspection conditions such as the kind (alternate current, direct current, and the like), intensity, magnetic field frequency, and the like of the magnetic field for inspection when the head is scanned forwards and backwards respectively. In addition, instead of setting a single time of reciprocating scanning as one unit, it is also possible to set a plurality of times of reciprocating scanning as one unit and switch the inspection conditions every reciprocating scanning or set N (N is an integer) times of reciprocating scanning plus forward scanning as one unit and change the inspection conditions for 2N+1 times of scanning. A treatment for changing the inspection conditions is carried out on the signal generator 60 by the control of the scanning controller 55.

As described above, the contained foreign metal is detected by scanning the magnetic sensors 43 to the article placed on the placing table 21, and thus, compared with an article and a magnetic sensor-fixed metal detection apparatus like a metal detection apparatus of the related art or a method in which an article is manually carried and passed over the magnetic sensors 43, more reliably metal detection can be carried out. In addition, it is possible to carry out inspection on one inspection article under a plurality of different conditions by changing the inspection conditions for the magnetic field for inspection in association with switching the scanning direction of the magnetic sensors 43 (the scanning direction of the head 40), and more accurate inspection is possible.

Figure 6A:
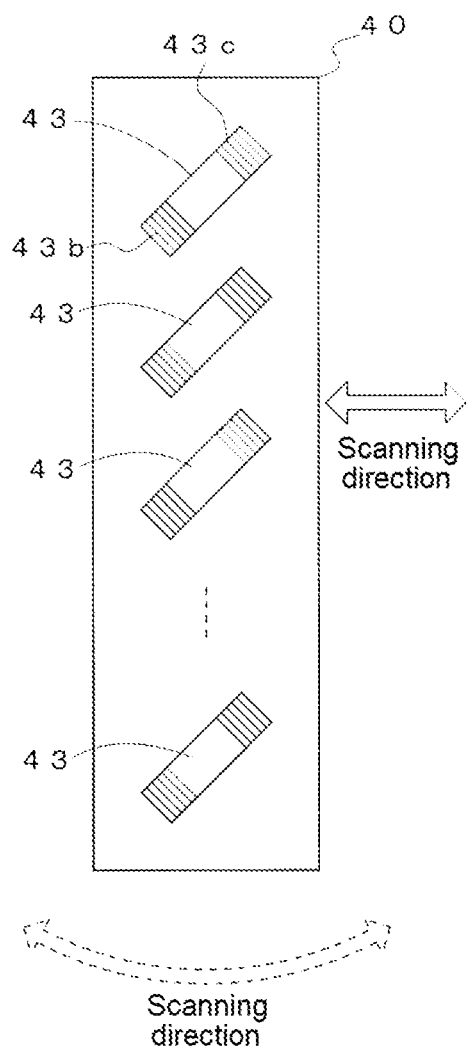
FIGS. 6A and 6B illustrate an example of an array of a plurality of magnetic sensors.
Figure 6B:
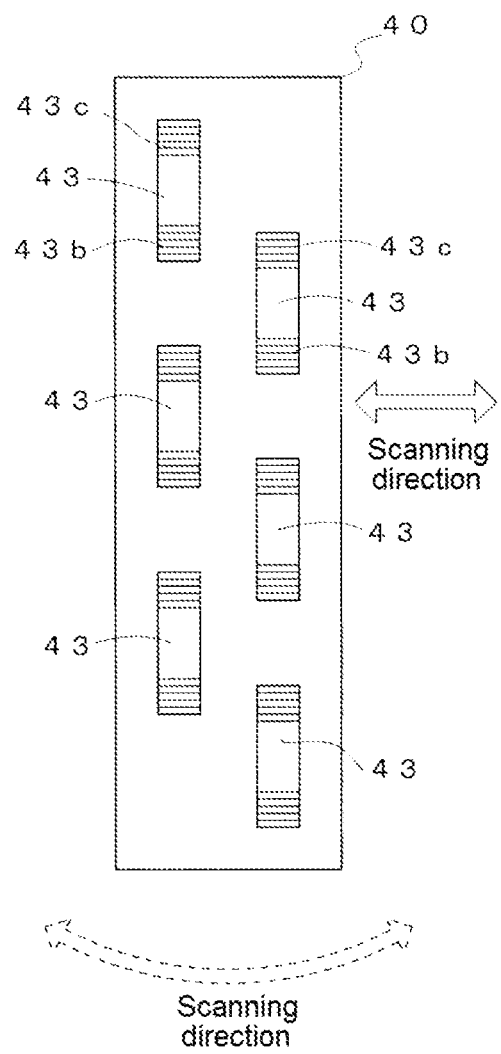

Meanwhile, the magnetic sensors 43 are fixed to an orientation in which the array direction of the pair of receiving coils 43b and 43c is orthogonal to the array direction of the magnetic sensors 43; however, the magnetic sensors 43 may be arrayed obliquely so that the array direction of the pair of receiving coils 43b and 43c forms an angle of, for example, 30 degrees, 45 degrees, or the like with respect to the array direction of the magnetic sensors 43 as illustrated in FIG. 6A or the array direction of the pair of receiving coils 43b and 43c of each of the magnetic sensor 43 may be along the array direction of the magnetic sensors 43 and a plurality of rows of the magnetic sensors may be arrayed in a state in which the locations of the respective magnetic sensors 43 do not match in the longitudinal direction as illustrated in FIG. 6B. In such a case, it is possible to further shorten the short side dimension of the head 40 and broaden the scanning region of the head 40.

Meanwhile, here, an example in which the magnetic sensor 43 is configured of a pair of the receiving coils differentially connected to each other has been described, but the magnetic sensor may be a single receiving coil or may be configured of a semiconductor-type element such as a Hall element. In addition, the scanning of the magnetic sensor 43 may be not only the above-described linearly reciprocating scanning but also, for example, rotationally reciprocating scanning around one end side (the upper end side in the drawing) or the middle portion of the head 40 as illustrated by dotted lines in FIGS. 6A and 6B. In addition, it is also possible to employ, instead of reciprocating scanning, a method in which the head 40 is continuously rotated in one direction (for example, clockwise) or a method in which the head is intermittently rotated in one direction (for example, clockwise).

In addition, in the embodiment, the transmission coil 42 and the magnetic sensors 43 are supported by the head 40 as the magnetic field generation means, but coils or magnets of the magnetic field generation means may be fixed. For example, a transmission coil having a larger size than the head scanning space is fixed to, for example, the upper surface, the inside (an embedded transmission coil is desirable in both cases), or the lower surface (any of an embedded transmission coil or a protruding transmission coil is preferable) of the placing table 21.

Figure 8A:
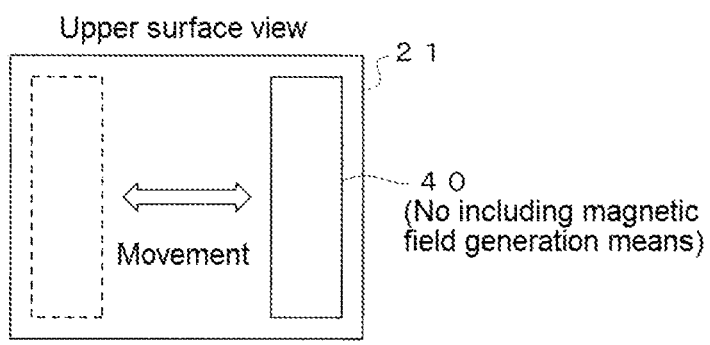
FIGS. 8A and 8B illustrate a relationship between a range of a magnetic field and a region of a placing table of a metal detection apparatus in which the magnetic field for inspection is fixed.
Figure 8B:
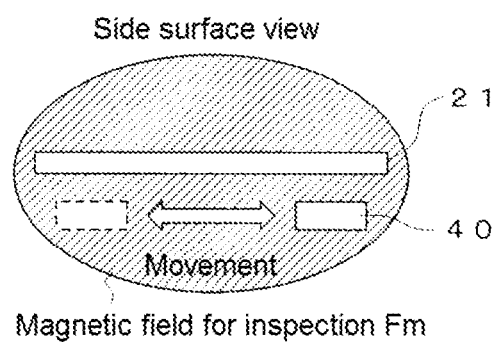

In the case of a metal detection apparatus in which the magnetic field for inspection is moved as in the embodiment, the range of a magnetic field for inspection Fm being generated by the transmission coil or magnets provided in the head 40 is limited to a largeness that covers the upper and lower regions of the placing table 21 only partially as illustrated in FIGS. 7A and 7B, and the upper and lower regions of the placing table 21 are wholly covered by scanning the head 40. In contrast, in the case of the above-described metal detection apparatus in which the magnetic field for inspection is fixed, the range of a magnetic field for inspection Fm being generated by a coil or a magnet fixed to the placing table 21, the case 30, or the like has a largeness enough to cover the entire upper and lower regions of the placing table 21 as illustrated in FIGS. 8A and 8B, and the magnetic field for inspection is steadily generated.

In the embodiment, as a signal for initiating the scanning of the head 40, the inspection control signal being generated by the operation of the operation panel 24 is used; however, as described above, it is also possible to provide article detection means 70 for detecting an article which is an inspection object placed on the placing table 21 and automate the article detection means.

As the article detection means 70, it is possible to use, for example, a method in which light shielding by an article is detected using an optical projector and receiver provided in the outer edge of the placing table 21 or the case 30, a method in which the load of an article is detected using a load sensor provided in the placing table 21 or the case 30, or the like.

Meanwhile, the metal detection apparatus and the metal detection method of the present invention can be used not only in the above-described SMKT or CVS, but also in places in which commercially available products cooked and processed in stores are provided to customers such as hamburger shops for a usage of detecting metal foreign substances contained in the products by mistake in the cooling or processing steps.

DESCRIPTION OF REFERENCE NUMERALS AND SIGNS

20 . . . METAL DETECTION APPARATUS, 21 . . . PLACING TABLE, MARK, 23 . . . REGION FRAME, 24 . . . OPERATION PANEL, 25 . . . DISPLAY UNIT, 30 . . . CASE, 40 . . . HEAD, 41 . . . SUBSTRATE, TRANSMISSION COIL, 43 . . . MAGNETIC SENSOR, 43A . . . CORE, 43$b$, 43$c$ . . . RECEIVING COIL, 51 . . . MOTOR, 52 . . . DRIVING SHAFT, SCANNING CONTROLLER, 60 . . . SIGNAL GENERATOR, 61 . . . DIFFERENTIAL AMPLIFIER, 62 . . . DETECTOR CIRCUIT, 63 . . . DETERMINATION MEANS, 64 . . . NOTIFICATION MEANS, 70 . . . ARTICLE DETECTION MEANS

What is claimed is:

1. A metal detection apparatus for detecting foreign metal being contained in an article which is an inspection object, the metal detection apparatus comprising:
a table for placing the article;
magnetic field generation means for generating a magnetic field for inspection over an upper surface with a predetermined largeness of the table on which the article is placed from a lower region of the table which overlaps the upper surface;
a magnetic sensor portion comprising at least one magnetic sensor and which is disposed in the lower region of the table and detects a near magnetic field with a sensing area narrower than the lower region;
scanning means for moving a location of the magnetic sensor portion from a first stand-by position to a second stand-by position so that the sensing area of the magnetic sensor portion covers the entire lower region of the table; and
determination means for determining presence or absence of the foreign metal being contained in the article placed on the table on the basis of a change in a magnetic field being detected by the magnetic sensor portion being moved by the scanning means.

2. The metal detection apparatus according to claim 1, wherein the scanning means is configured so as to move the magnetic sensor portion in a linear or rotational manner in the lower region, and
the magnetic field generation means changes an inspection condition for the magnetic field for inspection in association with switching a movement direction of the magnetic sensor portion by the scanning means.

3. The metal detection apparatus according to claim 1, further comprising:
article detection means for detecting that the article is placed on the upper surface of the table,
wherein the scanning means initiates movement of the magnetic sensor portion whenever the article detection means detects that the article is placed on the upper surface of the table.

4. A metal detection method for detecting foreign metal being contained into an article which is an inspection object, the metal detection method comprising:
a step of generating a magnetic field for inspection over an upper surface with a predetermined largeness in a table for placing the article from a lower region of the table which overlaps the upper surface;
a step of moving a location of a magnetic sensor portion which is disposed in the lower region of the table and detects a near magnetic field with a sensing area narrower than the lower region, the magnetic sensor portion being moved from a first stand-by position to a second stand-by position so that the sensing area of the magnetic sensor portion covers the entire lower region of the table; and
a step of detecting foreign metal being contained in the article placed on the table on the basis of a change in a magnetic field being detected by the magnetic sensor portion being moved.

5. The metal detection method according to claim 4, wherein the magnetic sensor portion is moved in a linear or rotational manner in the lower region, and
an inspection condition for the magnetic field for inspection is changed in association with switching a movement direction of the magnetic sensor portion.

6. The metal detection method according to claim 4, further comprising:
a step of detecting that the article is placed on the upper surface of the table,
wherein movement of the magnetic sensor portion is initiated whenever it is detected that the article is placed on the upper surface of the table.

7. A metal detection apparatus for detecting foreign metal contained in an article, the metal detection apparatus comprising:
- a table for placing the article;
- a magnetic field generator configured to generate a magnetic field for inspection over an upper surface with a predetermined largeness of the table on which the article is placed from a lower region of the table which overlaps the upper surface;
- a magnetic sensor disposed in the lower region of the table and that is configured to detect a near magnetic field with a sensing area narrower than the lower region;
- a scanner configured to move a location of the magnetic sensor from a first stand-by position to a second stand-by position so that the sensing area of the magnetic sensor portion covers the entire lower region of the table; and
- a controller configured to determine a presence or absence of the foreign metal contained in the article based on a change in a magnetic field being detected by the magnetic sensor moved by the scanner.

8. The metal detection apparatus according to claim 7, wherein:
- the scanner is further configured to move the magnetic sensor in a linear or rotational manner in the lower region, and
- the magnetic field generator is further configured to change an inspection condition for the magnetic field for inspection in association with switching a movement direction of the magnetic sensor by the scanner.

9. The metal detection apparatus according to claim 7, further comprising:
- an article detection sensor configured to detect that the article is placed on the upper surface of the table,
- wherein the scanner is configured to initiate movement of the magnetic sensor whenever the article detection sensor detects that the article is placed on the upper surface of the table.

* * * * *